(12) United States Patent
Xu et al.

(10) Patent No.: US 10,452,173 B2
(45) Date of Patent: Oct. 22, 2019

(54) DISPLAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jun Xu, Beijing (CN); Xiaojun Wu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 475 days.

(21) Appl. No.: 15/103,462

(22) PCT Filed: Jan. 14, 2016

(86) PCT No.: PCT/CN2016/070858
§ 371 (c)(1),
(2) Date: Jun. 10, 2016

(87) PCT Pub. No.: WO2017/024768
PCT Pub. Date: Feb. 16, 2017

(65) Prior Publication Data
US 2017/0199601 A1   Jul. 13, 2017

(30) Foreign Application Priority Data

Aug. 12, 2015 (CN) .......................... 2015 1 0493440

(51) Int. Cl.
*G02F 1/1333* (2006.01)
*G02F 1/1335* (2006.01)
(Continued)

(52) U.S. Cl.
CPC ........ *G06F 3/0412* (2013.01); *G02F 1/13338* (2013.01); *G02F 1/13394* (2013.01);
(Continued)

(58) Field of Classification Search
CPC . G06F 3/0412; H01L 27/323; H01L 27/3246; H01L 27/3283; H01L 51/5284;
(Continued)

(56) References Cited

U.S. PATENT DOCUMENTS 6,501,527 B1 * 12/2002 Hirose ................ G02F 1/13394
349/155
9,632,636 B2  4/2017 Wang
(Continued)

FOREIGN PATENT DOCUMENTS

| CN | 104156131 A | 11/2014 |
| CN | 104375710 A | 2/2015 |
| CN | 105094433 A | 11/2015 |

OTHER PUBLICATIONS

First office Action dated Aug. 1, 2017 in corresponding Chinese patent Application No. 201510493440.X.
(Continued)

*Primary Examiner* — Phu Vu
(74) *Attorney, Agent, or Firm* — Nath, Goldberg & Meyer; Joshua B. Goldberg

(57) ABSTRACT

A display substrate comprises a first structure and a second structure which are provided in a stack, two sides, opposite to each other, of the first structure and the second structure comprise mesh structures having a same periodic arrangement, respectively, wherein a lightness of a color of the mesh structure of the first structure is different from a lightness of a color of the mesh structure of the second structure.

14 Claims, 2 Drawing Sheets

(51) Int. Cl.
*G06F 3/041* (2006.01)
*G02F 1/1339* (2006.01)
*G02F 1/1343* (2006.01)
*H01L 27/32* (2006.01)
*H01L 51/52* (2006.01)

(52) U.S. Cl.
CPC .. *G02F 1/133512* (2013.01); *G02F 1/133514* (2013.01); *G02F 1/134336* (2013.01); *G06F 3/041* (2013.01); *H01L 27/323* (2013.01); *H01L 27/3246* (2013.01); *H01L 27/3283* (2013.01); *H01L 51/5284* (2013.01); *G02F 2201/15* (2013.01); *G06F 2203/04112* (2013.01)

(58) Field of Classification Search
CPC ........... G02F 1/13338; G02F 1/133512; G02F 1/134336; G02F 1/133514; G02F 1/13394
See application file for complete search history.

(56) References Cited

U.S. PATENT DOCUMENTS

| | | |
|---|---|---|
| 2009/0096767 A1 | 4/2009 | Liu et al. |
| 2010/0245285 A1 | 9/2010 | Wang et al. |
| 2015/0109236 A1 | 4/2015 | Wang et al. |
| 2015/0241728 A1* | 8/2015 | Hata ........................ G06F 3/041 345/173 |
| 2015/0261370 A1* | 9/2015 | Yoo ........................ G06F 3/0412 345/173 |
| 2016/0357303 A1 | 12/2016 | Xie et al. |

OTHER PUBLICATIONS

International Search Report dated Mar. 31, 2016 corresponding to International application No. PCT/CN2016/070858.
Written Opinion of the International Searching Authority dated Mar. 31, 2016 corresponding to International application No. PCT/CN2016/070858.

* cited by examiner

DISPLAY SUBSTRATE AND DISPLAY DEVICE

This is a National Phase Application filed under 35 U.S.C. 371 as a national stage of PCT/CN2016/070858, filed Jan. 14, 2016, an application claiming the benefit of Chinese Application No. 201510493440.X, filed Aug. 12, 2015, the content of each of which is hereby incorporated by reference in its entirety.

FIELD OF THE INVENTION

The present invention relates to the field of display technology, and in particular, relates to a display substrate and a display device.

BACKGROUND OF THE INVENTION

In the information age, there is a need to display information. Thus, a display device, which is a device for displaying information, is playing an increasingly important role. At present, the display means being dominant on the market is flat panel display which includes liquid crystal display and OLED display. A flat panel display device has a plurality of sub-pixels therein, and the plurality of sub-pixels are spaced apart from each other to form a mesh structure. In order to ensure the effect of blocking light, a black matrix is commonly provided at the position corresponding to the mesh structure. In general, flat panel display devices have been widely used in many applications such as computers, TV sets, mobile terminals, and the like due to their advantages of thin type, lightweight, low power consumption, and the like.

Currently, a flat panel display device is further integrated with a touch function, to facilitate ease of using the display device and improvement of user's experience of using the display device. In the flat panel display device, a touch panel and a display panel may be separately prepared and then attached to each other, or may be integrally formed. In order to sense and collect a touch signal, a plurality of dark colored touch electrodes (i.e., a metal mesh), which are arranged to cross each other, are included in the touch panel, and are generally provided in the corresponding gaps between the sub-pixels of the display panel so as not to degrade the display effect. However, the touch electrodes cannot be provided to completely overlap the gaps between the sub-pixels of the display panel, regardless of separate preparation or integral formation of the touch panel and the display panel. In this case, a mesh structure including the black matrix of the display panel and a mesh structure including the metal mesh of the touch panel are easy to interfere with each other to form Moire fringes.

Moire fringes result in a major optical problem making trouble in the field of display technology, and even result in a key problem in an application including a mesh structure. Existing solutions to Moire fringes are generally to eliminate the Moire fringes by reducing a period of the Moire fringes. However, researches have show that elimination of Moire fringes by adjusting a period of the Moire fringes is limited to factors such as a resistance of the mesh structure, uniformity of the mesh structure, and the like.

Thus, it is a technical problem to be solved urgently to design a solution which subjects to little limitation, is easy to be implemented, and has good effect of eliminating Moire fringes.

SUMMARY OF THE INVENTION

In view of the above disadvantages existing in the prior art, an object of the present invention is to provide a display substrate and a display device, the display substrate having fewer Moire fringes or no Moire fringe, and having a better display effect.

Some embodiments of the present invention provide a display substrate, which includes a first structure and a second structure which are provided in a stack, two sides, opposite to each other, of the first structure and the second structure include mesh structures having a same periodic arrangement, respectively, wherein a lightness of a color of the mesh structure of the first structure is different from a lightness of a color of the mesh structure of the second structure.

For example, the lightness of the color of the mesh structure of the first structure is a dark lightness, and the lightness of the color of the mesh structure of the second structure is a bright lightness.

For example, a lightness of a color of a material forming the mesh structure of the first structure is a dark lightness, and a lightness of a color of a material forming the mesh structure of the second structure is a bright lightness.

For example, the first structure is a touch panel, of which the mesh structure includes touch electrodes provided to vertically cross each other; and the second structure is a display panel including a plurality of sub-pixels arranged in an array, the mesh structure of the display panel includes a pixel-spacer layer provided between the sub-pixels, and the pixel-spacer layer includes at least an interference eliminating layer made of a material having a bright lightness.

For example, the display panel is a liquid crystal display panel including a color-filter substrate and an array substrate provided opposite to each other, the color-filter substrate includes a plurality of color-filter layers which are provided so that they space apart from each other and their colors are arranged cyclically;

wherein, the pixel-spacer layer is provided between adjacent color-filter layers of the color-filter substrate, and further includes a black-matrix layer made of a material of black resin, the black-matrix layer and the interference eliminating layer have a same shape and completely overlap in an orthogonal projection direction.

For example, the interference eliminating layer is formed above the black-matrix layer by a patterning process, so that the interference eliminating layer is farther away from the array substrate than the black-matrix layer.

For example, the display panel is an OLED display panel including a plurality of OLEDs provided to space apart from each other, wherein, the pixel-spacer layer is provided between adjacent OLEDs, and further includes a pixel definition layer made of a material of black resin, the pixel definition layer and the interference eliminating layer have a same shape and completely overlap in an orthogonal projection direction.

For example, the interference eliminating layer is formed above the pixel definition layer by a patterning process, so that the interference eliminating layer is closer to the touch panel than the pixel definition layer.

For example, the interference eliminating layer is made of a material of white resin.

For example, the mesh structure of the first structure is made of a metal material of dark lightness.

Some embodiments of the present invention provide a display device, which includes the display substrate as described above.

The advantageous technical effects of the present invention are as follows. The display substrate weakens or eliminates Moire fringes by the method that the mesh structures having a same periodic arrangement are made of materials having different lightnesses, respectively. The method of eliminating Moire fringes of the display substrate is simpler and more general than the method of reducing a period of the Moire fringes in the prior art.

DESCRIPTION OF THE REFERENCE NUMERALS

1—touch panel, 11—touch electrode, 2—display panel, 21—color-filter substrate, 211—first substrate, 212—color-filter layer, 213—interference eliminating layer, 214—black-matrix layer, 22—array substrate, 221—second substrate, 222—data line, 223—thin film transistor, 23—liquid crystal molecule.

DETAILED DESCRIPTION OF THE EMBODIMENTS

To make those skilled in the art better understand the technical solutions of the present invention, a display substrate and a display device provided by the present invention will be described below in detail with reference to the accompanying drawings and the following embodiments.

The technical concept of the present invention is as follows. Moire fringes are interference fringes generated by objects having certain intervals therebetween, and are in essence a visual phenomenon. In principle, Moire fringes are the result of recognizing a periodic structure by human eyes. Human eyes' perception of Moire fringes depends on two objective factors, i.e., a period and a lightness contrast of the fringes. In a case where fringes have a high lightness contrast, human eyes may not be able to recognize the Moire fringes even though the fringes have a sufficiently large period. The present invention breaks through the concept of conventional methods in the prior art, focuses on the visual effect perceived by human eyes, and adopts a method different from that reduces a period of Moire fringes in the prior art. Specifically, the present invention weakens or eliminates Moire fringes by reducing a contrast of the fringes.

First Embodiment

Figure 1:
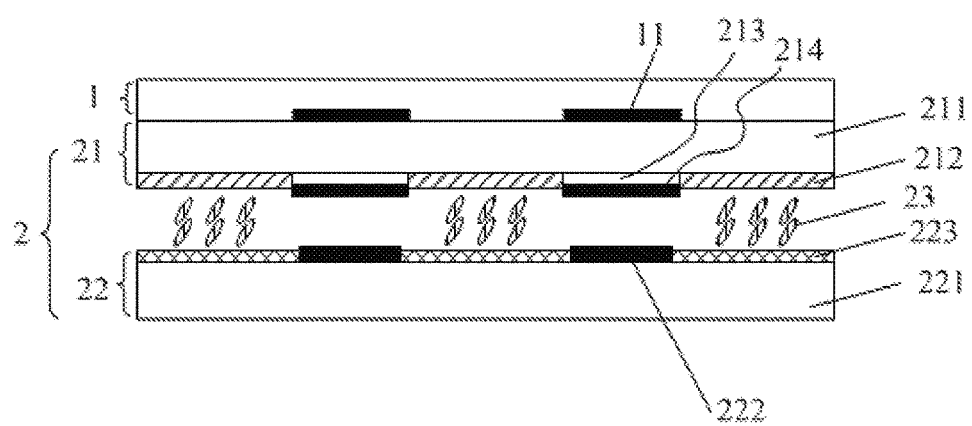
FIG. 1 is a schematic diagram showing a structure of a display substrate according to a second embodiment of the present invention.

The present embodiment provides a display substrate, which includes a first structure and a second structure which are provided in a stack, two sides (e.g., one side where touch electrodes 11 are located and another side where interference eliminating layers 213 are located, as shown in FIG. 1), which are opposite to each other, of the first structure and the second structure include mesh structures having a same periodic arrangement, respectively, wherein a lightness of a color of the mesh structure of the first structure is different from a lightness of a color of the mesh structure of the second structure. Here, a lightness is one of the three elements (which are a lightness, a purity and a hue, respectively) of a color, and is a degree of brightness of the color. In general, black has a lowest lightness, and white has a highest lightness.

In plain words, a lightness contrast is a contrast between the brightness and darkness of a color, and is also known as a contrast between black and white of the color. A lightness contrast is a most important element of the constitution of a color, and mainly represents a relationship between the level and space of the color. The contour of a pattern is difficult to be recognized if there is only a hue contrast but no a lightness contrast, and is even more difficult to be recognized if there is only a purity contrast but no a lightness contrast. The present invention identifies the important function of a lightness contrast for representing a contour, and applies it to a display substrate, so as to eliminate the interference effect between mesh structures having a same periodic arrangement, and to bring a better display effect to human visual sensation.

In the display substrate according to the present embodiment, the lightness of the color of the mesh structure of the first structure is a dark lightness, and the lightness of the color of the mesh structure of the second structure is a bright lightness. For example, a lightness of a color of a material forming the mesh structure of the first structure is a dark lightness, and a lightness of a color of a material forming the mesh structure of the second structure is a bright lightness.

The display substrate according to the present embodiment weakens or eliminates Moire fringes by the method that the mesh structures, having a same periodic arrangement, of the touch panel and the display panel are made of materials having different lightnesses, respectively. The method of eliminating Moire fringes of the display substrate is simpler and more general than the method of reducing a period of the Moire fringes in the prior art.

Second Embodiment

The present embodiment provides a display substrate, which has fewer Moire fringes or no Moire fringe, and has a better display effect.

As a specific application of the first embodiment, as shown in FIG. 1, in the display substrate according to the present embodiment, the first structure is a touch panel 1, of which the mesh structure includes touch electrodes 11 provided to vertically cross each other; and the second structure is a display panel 2 including a plurality of sub-pixels arranged in an array, the mesh structure of the display panel 2 includes pixel-spacer layers each provided between the sub-pixels, and each pixel-spacer layer includes at least an interference eliminating layer 213 made of a material having a bright lightness. In the display substrate, the mesh structure including the touch electrodes 11 of the touch panel 1 and the mesh structure of the display panel 2 have a same shape. Further, the generation of Moire fringes is weakened or eliminated by forming the interference eliminating layer 213 in the pixel-spacer layer of the display panel 2.

Specifically, as shown in FIG. 1, the display panel 2 may be a liquid crystal display panel including a color-filter substrate 21 and an array substrate 22 provided opposite to each other. The color-filter substrate 21 includes a plurality of color-filter layers 212 which are provided so that they space apart from each other and their colors are arranged cyclically (e.g., the plurality of color-filter layers 212 are arranged in the horizontal direction but not in the vertical direction, as shown in FIG. 1), and the plurality of color-filter layers 212 are provided at a side of a first substrate 211 which is close to the array substrate 22. The pixel-spacer layer is provided between adjacent color-filter layers 212 of the color-filter substrate 21, and further includes a black-matrix layer 214 made of a material of black resin. The black-matrix layer 214 and the interference eliminating layer 213 have a same shape and completely overlap in an orthogonal projection direction. In the liquid crystal display panel, gate lines (not shown in FIG. 1) and data lines 222, which are arranged to cross each other, are provided in regions of the array substrate 22 which correspond to the pixel-spacer layers, and define pixel regions provided with a plurality of thin film transistors 223 which are arranged in an array. Rotation of liquid crystal molecules 23 is controlled by an electric field generated by the turn-off or turn-on of the thin film transistors 223, so as to control transmission of light, the display of various color images is realized by the rendering of the color-filter layers 212. In the present embodiment, the black-matrix layer 214 is formed in addition to the formation of the interference eliminating layer 213, which facilitates that light blocking between adjacent sub-pixels in the liquid crystal display panel is ensured, and the display quality is ensured.

Figure 2:
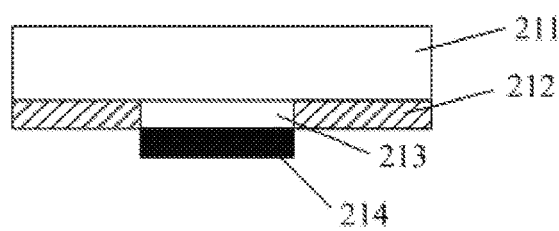
FIG. 2 is an enlarged diagram showing a portion of a color-filter substrate as shown in FIG. 1.

As shown in FIG. 2, the interference eliminating layer 213 is formed above the black-matrix layer 214 by a patterning process, so that the interference eliminating layer 213 is farther away from the array substrate than the black-matrix layer 214 (i.e., human eyes are closer to the interference eliminating layer 213 than to the array substrate when viewing a displayed image). Since the interference eliminating layer 213 and the black-matrix layer 214 have a same shape, and thus can be formed in a single patterning process by a single mask. Accordingly, the formation of the interference eliminating layer 213 by a patterning process will not result in an additional process step, and the patterning process is mature and simple, thereby ensuring a high rate of qualified product.

Figure 3:
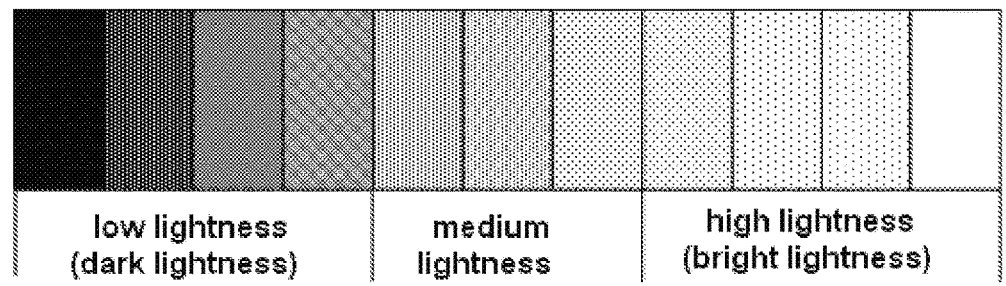
FIG. 3 is a schematic diagram showing a color scale of lightness.

In the diagram showing a color scale of lightness as shown in FIG. 3, a lightness ranging from scales 0 to 3 is referred to as a low lightness, i.e., a dark lightness, a lightness ranging from scales 4 to 6 is referred to as a medium lightness, and a lightness ranging from scales 7 to 10 is referred to as a high lightness, i.e., a bright lightness. An intensity of a lightness contrast is determined by a difference between the lightnesses of colors. A contrast not more than three scales is referred to as a short tone contrast; a contrast larger than three scales and not more than five scales is referred to as a medium lightness contrast, and also as known as a medium tone contrast; and a contrast larger than five scales is referred to as a strong lightness contrast, and also known as a long tone contrast. In the display substrate according to the present embodiment, the effect of weakening or eliminating Moire fringes is best if a lightness contrast between the colors of the materials forming the touch electrodes 11 and the interference eliminating layers 213 is a strong lightness contrast or a long tone contrast. However, the present invention is not limited thereto, and a lightness contrast between the colors of the materials forming the touch electrodes 11 and the interference eliminating layers 213 may be selected according to a practical application.

For example, each interference eliminating layer 213 is made of a material of white resin (or a white photoresist material), and the material of white resin (or the white photoresist material) is preferably doped with TiO$_2$ therein. The mesh structure formed by the touch electrodes 11 of the touch panel 1 is made of an opaque metal material of dark lightness (e.g., copper, nano silver, graphene, or the like). Further, in the display panel 2 of the display substrate, a black-matrix layer 214, which is at a side of the color-filter substrate 21, made of only a material of black resin in the prior art is replaced with the pixel-spacer layer including two layers made of a material of black resin and a material of white resin, respectively, and the layer made of a material of white resin is provided to be closer to the touch panel 1. FIG. 2 shows a stack structure of the pixel-spacer layer (which includes the interference eliminating layer 213 and the black-matrix layer 214). In the above configuration, the interference eliminating layer 213 made of a material of white resin is closer to human eyes than the black-matrix layer 214, and has a largest lightness contrast to the touch electrode 11 made of a metal material of dark lightness. Thus, the effect of eliminating Moire fringes is optimal.

Figure 4A:
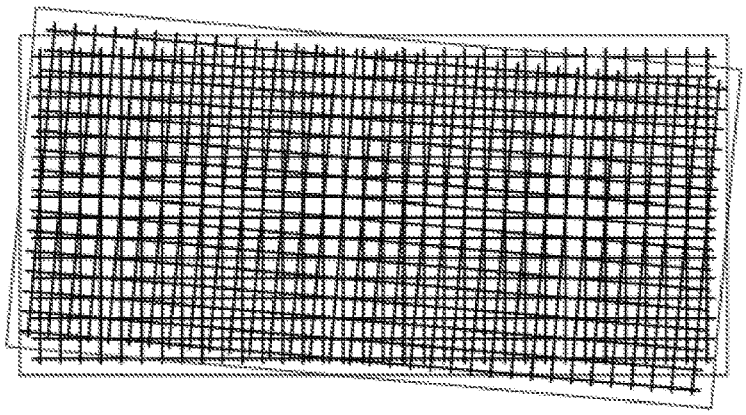
FIGS. 4A to 4C are schematic diagrams showing the Moire fringes generated in cases where a mesh structure in a touch panel and that in a display panel are made of materials with colors having different lightness contrasts.
Figure 4B:
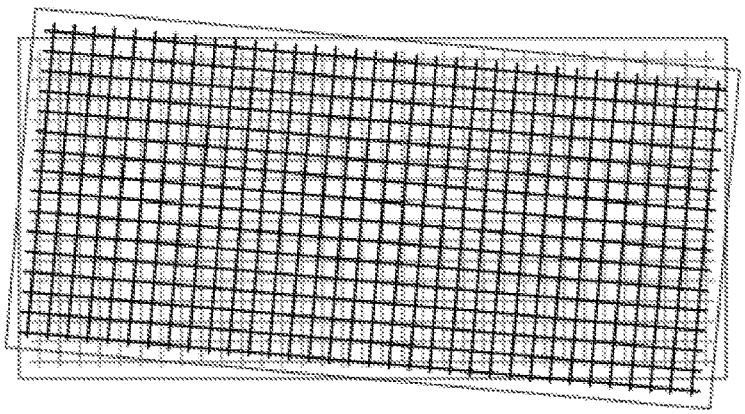
Figure 4C:
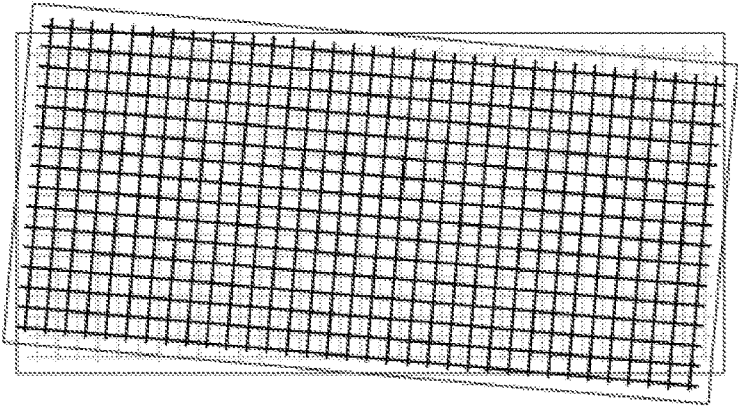

The diagrams shown in FIGS. 4A to 4C are visual comparison diagrams of the mesh structure including the touch electrodes 11 with the mesh structure including the interference eliminating layers 213 in cases where the touch electrodes 11 and the interference eliminating layers 213 are made of materials having different lightness contrasts, respectively, wherein, the touch electrodes 11 (in the touch panel 1) are in an upper layer, and the interference eliminating layers 213 (in the display panel 2) are in a lower layer. A ratio of the stripe gray value of the mesh structure including the touch electrodes 11 to that of the mesh structure including the interference eliminating layers 213 in FIG. 4A is 1:1, that is, both the touch electrodes 11 and the interference eliminating layers 213 are made of a material having a same color (i.e., black). A ratio of the stripe gray value of the mesh structure including the touch electrodes 11 to that of the mesh structure including the interference eliminating layers 213 in FIG. 4B is 1:2. A ratio of the stripe gray value of the mesh structure including the touch electrodes 11 to that of the mesh structure including the interference eliminating layers 213 in FIG. 4C is 1:5. It can be seen from the comparison among FIGS. 4A, 4B and 4C, with the increase of the lightness contrast between the materials forming the touch electrodes 11 included in one mesh structure and the interference eliminating layers 213 included in another mesh structure, the effect of Moire fringes is gradually weakened and then eliminated.

Of course, in a case where the requirement of blocking light between pixels of the display panel can be met by other means than the a black matrix, the pixel-spacer layer may include only the interference eliminating layer 213 made of a material of white resin, and the black-matrix layer 214 made of a material of black resin may be omitted, thereby further simplifying the manufacturing process thereof.

The display substrate according to the present embodiment, by complying with the above vision principle, enables the touch electrodes arranged in a mesh in the touch panel to not interference with the pixel-spacer layer in the display panel, thereby weakening or eliminating Moire fringes. Thus, a solution other than that changing a period of Moire fringes, i.e., a solution of reducing a contrast of the fringes, is feasible to eliminate Moire fringes and has a good effect.

The display substrate according to the present embodiment has weaker Moire fringes or has no Moire fringe at all, and ensures a good display effect.

Third Embodiment

The present embodiment provides a display substrate as another specific application of the first embodiment. The display substrate according to the present embodiment differs from that of the second embodiment in that the display panel in the present embodiment is an OLED display panel.

In the display substrate, the first structure is a touch panel, of which the mesh structure includes touch electrodes provided to vertically cross each other. The second structure is a display panel including a plurality of sub-pixels arranged in an array, the mesh structure of the display panel includes a pixel-spacer layer provided between the sub-pixels, and the pixel-spacer layer includes at least an interference eliminating layer made of a material having a light color.

The display panel in the present embodiment is an OLED display panel including a plurality of OLEDs provided to space apart from each other. The pixel-spacer layer is provided between adjacent OLEDs, and further includes a pixel definition layer made of a material of black resin. The pixel definition layer and the interference eliminating layer have a same shape and completely overlap in an orthogonal projection direction.

For example, the interference eliminating layer is formed above the pixel definition layer by a patterning process, so that the interference eliminating layer is closer to the touch panel than the pixel definition layer. The interference eliminating layer is made of a material of white resin (or a white photoresist material), and the material of white resin (or the white photoresist material) is preferably doped with $TiO_2$ therein. The mesh structure of the touch panel is made of a metal material of dark lightness (e.g., copper, nano silver, graphene, or the like).

The principle of weakening or eliminating Moire fringes by the display substrate according to the present embodiment is the same as that of weakening or eliminating Moire fringes by the display substrate according to the second embodiment, and description thereof is omitted.

The display substrate according to the present embodiment has weaker Moire fringes or has no Moire fringe at all, and ensures a good display effect.

It is apparent that, although the solutions, provided by the first to third embodiments, to eliminate Moire fringes by reducing the contrast of the fringes, are described by taking the touch panel and the display panel which respectively include mesh structures having a same periodic arrangement in the field of display technology as an example, they are not limited thereto and applicable to all applications, which have Moire fringes therein to be eliminated, in other fields. Further, as compared with a solution to eliminate Moire fringes by adjusting a period of the fringes, the solutions provided by the embodiments of the present invention have advantages that they can be easier to carry out and more general, and will not subject to an additional design constraint.

Fourth Embodiment

The present embodiment provides a display device including the display substrate according to the second or third embodiment.

The display device may be any product or component having a display function, such as a liquid crystal panel, electronic paper, an OLED panel, a mobile phone, a tablet computer, a television set, a display, a laptop computer, a digital photo frame, a navigator, and the like.

The display device according to the present embodiment has a good display effect due to including the display substrate, which has weaker Moire fringes or has no Moire fringe at all, according to the second or third embodiment.

It should be understood that, the foregoing embodiments are only exemplary embodiments used for explaining the principle of the present invention, but the present invention is not limited thereto. Various variations and improvements may be made by a person skilled in the art without departing from the spirit and essence of the present invention, and these variations and improvements also fall into the protection scope of the present invention.

What is claimed is:

1. A display substrate, comprising a first structure and a second structure which are provided in a stack, two sides, opposite to each other, of the first structure and the second structure comprise mesh structures having a same periodic arrangement, respectively, wherein a lightness of a color of the mesh structure of the first structure is different from a lightness of a color of the mesh structure of the second structure;

wherein the first structure is a touch panel, of which the mesh structure comprises touch electrodes provided to vertically cross each other;

the second structure is a display panel comprising a plurality of sub-pixels arranged in an array, the mesh structure of the display panel comprises a pixel-spacer layer provided between the sub-pixels, and the pixel-spacer layer comprises at least an interference eliminating layer made of a material having a bright lightness;

wherein the display panel is a liquid crystal display panel comprising a color-filter substrate and an array substrate provided opposite to each other, the color-filter substrate comprises a plurality of color-filter layers which are provided so that they space apart from each other and their colors are arranged cyclically;

wherein the pixel-spacer layer is provided between adjacent color-filter layers of the color-filter substrate, and further comprises a black-matrix layer made of a material of black resin, the black-matrix layer and the interference eliminating layer have a same shape and completely overlap in an orthogonal projection direction; and wherein the interference eliminating layer is formed above the black-matrix layer by a patterning process, so that the interference eliminating layer is farther away from the array substrate than the black-matrix layer.

2. The display substrate according to claim 1, wherein, the lightness of the color of the mesh structure of the first structure is a dark lightness, and the lightness of the color of the mesh structure of the second structure is a bright lightness.

3. The display substrate according to claim 1, wherein, a lightness of a color of a material forming the mesh structure of the first structure is a dark lightness, and a lightness of a color of a material forming the mesh structure of the second structure is a bright lightness.

4. A display substrate, comprising a first structure and a second structure which are provided in a stack, two sides, opposite to each other, of the first structure and the second structure comprise mesh structures having a same periodic arrangement, respectively, wherein a lightness of a color of the mesh structure of the first structure is different from a lightness of a color of the mesh structure of the second structure;

wherein the first structure is a touch panel, of which the mesh structure comprises touch electrodes provided to vertically cross each other;

the second structure is a display panel comprising a plurality of sub-pixels arranged in an array, the mesh structure of the display panel comprises a pixel-spacer layer provided between the sub-pixels, and the pixel-spacer layer comprises at least an interference eliminating layer made of a material having a bright lightness;

wherein the display panel is an OLED display panel comprising a plurality of OLEDs provided to space apart from each other;

wherein the pixel-spacer layer is provided between adjacent OLEDs, and further comprises a pixel definition layer made of a material of black resin, the pixel definition layer and the interference eliminating layer have a same shape and completely overlap in an orthogonal projection direction; and wherein the interference eliminating layer is formed above the pixel definition layer by a patterning process, so that the interference eliminating layer is closer to the touch panel than the pixel definition layer.

5. The display substrate according claim 1, wherein, the interference eliminating layer is made of a material of white resin.

6. The display substrate according to claim 1, wherein, the mesh structure of the first structure is made of a metal material of dark lightness.

7. A display device, comprising the display substrate according to claim 1.

8. The display substrate according to claim 4, wherein, the interference eliminating layer is made of a material of white resin.

9. The display substrate according to claim 2, wherein, the mesh structure of the first structure is made of a metal material of dark lightness.

10. The display substrate according to claim 3, wherein, the mesh structure of the first structure is made of a metal material of dark lightness.

11. The display substrate according to claim 4, wherein, the mesh structure of the first structure is made of a metal material of dark lightness.

12. The display substrate according to claim 4, wherein, the lightness of the color of the mesh structure of the first structure is a dark lightness, and the lightness of the color of the mesh structure of the second structure is a bright lightness.

13. The display substrate according to claim 4, wherein, a lightness of a color of a material forming the mesh structure of the first structure is a dark lightness, and a lightness of a color of a material forming the mesh structure of the second structure is a bright lightness.

14. A display device, comprising the display substrate according to claim 4.

* * * * *